United States Patent
Liu et al.

(10) Patent No.: US 7,276,420 B2
(45) Date of Patent: Oct. 2, 2007

(54) METHOD OF MANUFACTURING A PASSIVE INTEGRATED MATCHING NETWORK FOR POWER AMPLIFIERS

(75) Inventors: Lianjun Liu, Gilbert, AZ (US); Qiang Li, Gilbert, AZ (US); Melvy F. Miller, Tempe, AZ (US); Sergio P. Pacheco, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 242 days.

(21) Appl. No.: 11/179,685

(22) Filed: Jul. 11, 2005

(65) Prior Publication Data

US 2007/0007622 A1    Jan. 11, 2007

(51) Int. Cl.
*H01L 21/338* (2006.01)
*H01L 21/337* (2006.01)
*H01L 21/8222* (2006.01)
*H01L 21/20* (2006.01)

(52) U.S. Cl. .............. 438/329; 438/171; 438/190; 438/210; 438/393

(58) Field of Classification Search ............ 438/171, 438/190, 210, 329, 393
See application file for complete search history.

(56) References Cited

U.S. PATENT DOCUMENTS 6,512,285 B1 *   1/2003   Hashemi et al. ............ 257/531
2005/0236689 A1 * 10/2005   Sugiura et al. ............ 257/531

* cited by examiner

*Primary Examiner*—Cuong Nguyen
(74) *Attorney, Agent, or Firm*—Ingrassia Fisher Lorenz

(57) ABSTRACT

An impedance matching network is integrated on a first die and coupled to a second die, with the first and second dies mounted on a conductive back plate. The impedance matching network comprises a first inductor bridging between the first and second dies, a second inductor coupled to the first inductor and disposed on the first die, and a metal-insulator-metal (MIM) capacitor disposed on the first die. The MIM capacitor has a first metal layer coupled to the second inductor, and a second metal layer grounded to the conductive back plate. A method for manufacturing the integrated impedance matching network comprises the steps of forming an inductor on a die, forming a capacitor on the die, coupling the capacitor to the inductor, coupling the die bottom surface and the capacitor to a conductive plate, and coupling the inductor to another inductor that bridges between the die and another die.

20 Claims, 3 Drawing Sheets

METHOD OF MANUFACTURING A PASSIVE INTEGRATED MATCHING NETWORK FOR POWER AMPLIFIERS

TECHNICAL FIELD

The present invention relates generally to electronic components that receive and transmit a signal. More particularly, the present invention relates to matching networks for use with such electronic components.

BACKGROUND

Electronic devices and components that are designed for high frequency data communication applications have numerous applications. One common practical application for such devices and components is cellular telephony systems. In this regard, the need for component integration has become progressively more important for increasingly miniaturized high performance cellular phones with advanced features.

Cellular phone high power amplifier stations use matching circuits and power amplification circuits to match the impedances in a relatively weak cellular telephone signal and to amplify and transmit the signal. The LDMOS power amplification system illustrated in FIG. 1 is one in-package power amplification system that successfully incorporates passive elements, including passive inductors and capacitors, in a highly integrated impedance matching network. The illustrated power amplification system 100 includes a metal flange 102 that functions as a support and as an electrical ground. A ceramic substrate 104 is formed on the metal flange 102 and insulates the flange 102 from the power amplification circuitry, which includes a gate lead 106, a drain lead 108, and an array of inductor bond wires 114 that connect matching capacitors 110 and active devices 112.

FIG. 2 is a circuit diagram for a power amplifier (PA) system. The equivalent circuit schematics for the assembly represented in FIG. 1 is shown in box 200. Box 210 represents a large capacitance in series with a small inductance, which together realize the shunt LC matching network. This part of the MOSCAP matching network includes long bond wires that connect the MOSCAP die to the LDMOS output drain, which is located on a base station power amplifier die. The bond wires are commonly assembled with a height of approximately 45 mils (~1.1 mm) in order to realize an appropriate inductance value. The bond wire length for this assembly creates difficulties when assembling and operating the power amplifier. Slack bond wire is difficult to control during manufacturing. Further, longer bond wires become hotter and less reliable during operation than shorter bond wires, and also cause relatively wide inductance variations.

One of the most significant parameters for evaluating the performance of a shunt matching network is the network's Q factor. The Q factor refers to the measure of quality of a particular frequency response, and is correlated with a storage:loss ratio. The simulated Q factor for the current bond wire+MOSCAP system is about 60, although 60 is toward the lower end of the range of acceptable Q factors for the shunt LC matching network.

Accordingly, it is desirable to provide a shunt LC matching network having a Q factor that is higher than 60 and that can be manufactured with efficiency. It is also desirable for the matching network to utilize quality passive devices in order for the matching network to be easily controlled during manufacturing, and to have a relatively low parts count. It is also desirable for such a matching network to have improved reliability. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

Figure 1:
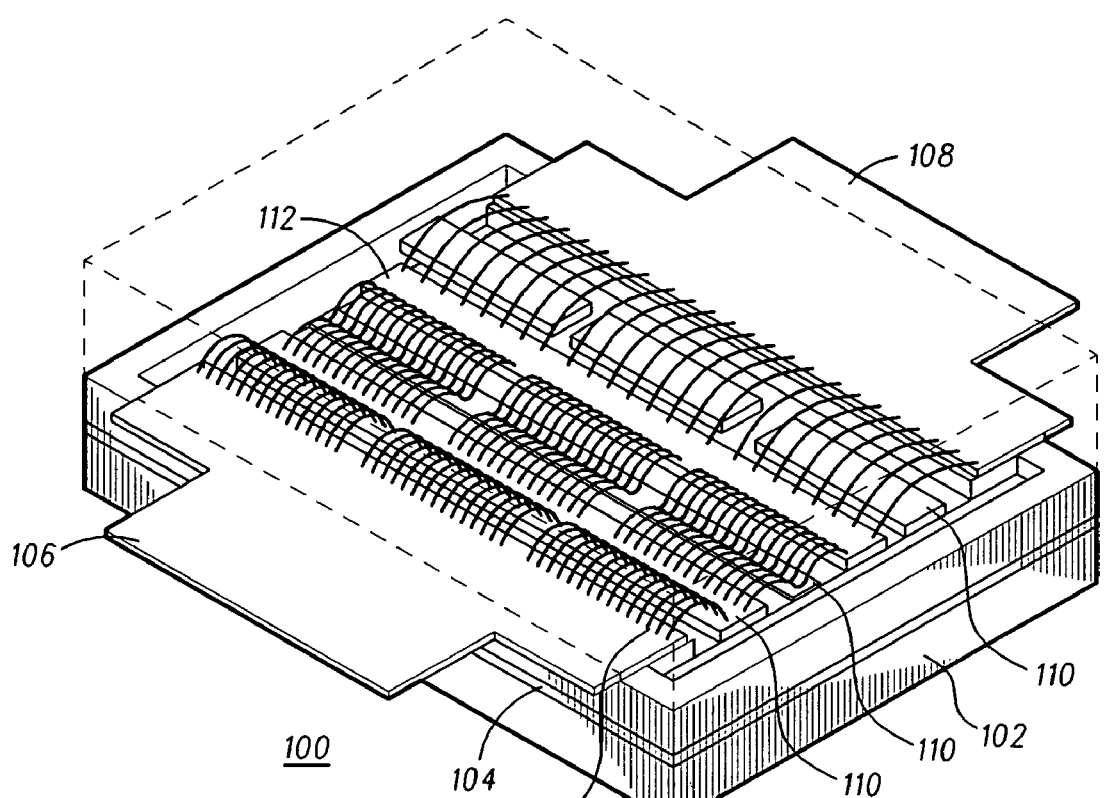
FIG. 1 is a top isometric view of an LDMOS power amplification system.
Figure 2:
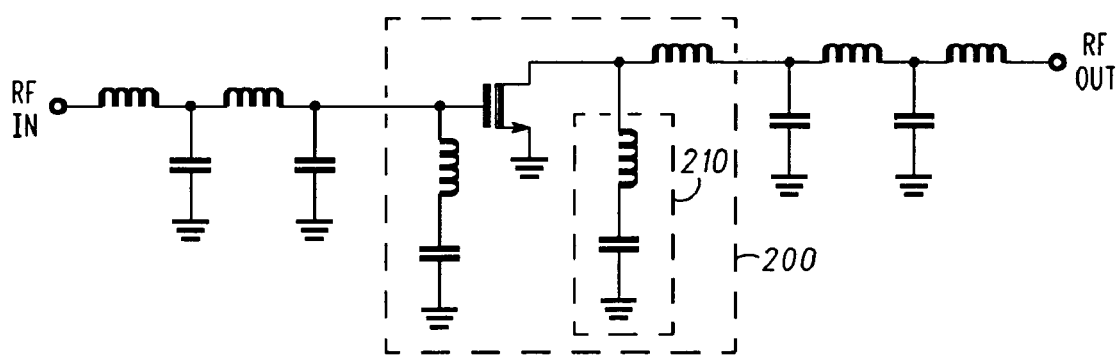
FIG. 2 is a circuit diagram for a LDMOS power amplifier system including a shunt LC output impedance matching network.

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or schematic components. It should be appreciated that such components may be realized in any number of practical ways. For example, an embodiment of the invention may employ various elements, e.g., conductive traces, wire bonds, integrated passive devices, semiconductor substrate materials, dielectric materials, or the like, which may have characteristics or properties known to those skilled in the art. In addition, those skilled in the art will appreciate that the present invention may be practiced in conjunction with any number of practical circuit topologies and applications, and that the circuits described herein in conjunction with the inventive impedance matching circuits are merely example applications for the invention.

According to one embodiment of the invention, a method is provided for manufacturing an integrated impedance matching network. The method comprises the first step of forming a first inductor on a first die having top and bottom surfaces. The first die may be a die that comprises GaAs, and may have a thickness that is between about 75 and about 200 µm. The method further comprises the steps of forming a capacitor first metal layer on the first die top surface, forming an insulator layer on the capacitor first metal layer, forming a capacitor second metal layer on the insulator layer, and forming a third metal layer to couple the capacitor second metal layer to the first inductor, mounting the first die bottom surface to a conductive plate, coupling the capacitor first metal layer to the conductive plate, and coupling the first inductor to a second inductor that bridges between the first die and a second die that is mounted on the conductive plate.

The second die may comprise a power amplification circuit. More particularly, the integrated impedance matching network may be part of a power amplifier for a base station that amplifies and transmits remote signals.

The second inductor may comprise a plurality of bond wires, and the first inductor may comprise a plurality of metal strips. Each of the metal strips may be more than 8 μm in thickness, and more than 40 μm in width. Further, each of the bond wires may be between about 10 mils and about 30 mils in height (between about 250 and about 750 μm).

The step of coupling the capacitor first metal layer to the conductive plate may comprise the steps of forming a via hole through the first die before mounting the first die bottom surface, and filling the via hole with an interconnect metal.

The first inductor, and the capacitor first and second metal layers may be formed from the same materials. Further, the step of forming the first inductor may be performed while performing one or more of the steps of forming the capacitor first and second metal layers and the step of coupling the capacitor second metal layer to the first inductor. If one or more of these steps are performed substantially simultaneously, the first inductor is formed using the same metals as the capacitor first and second metal layers and/or the material used to couple the second metal layer to the first inductor.

According to another embodiment of the invention, an impedance matching network is integrated on a first die and coupled to a second die, with the first and second dies mounted on a conductive back plate. The impedance matching network comprises a first inductor bridging between the first and second dies, a second inductor coupled to the first inductor and disposed on the first die, and a metal-insulator-metal (MIM) capacitor disposed on the first die. The MIM capacitor has a first metal layer coupled to the second inductor, and a second metal layer grounded to the conductive back plate. The first die may be a die comprising GaAs, and may have a thickness that is between about 75 and about 200 μm. The second die may comprise a power amplification circuit.

The first inductor may comprise a plurality of bond wires, and the second inductor may accordingly comprise a plurality of metal strips. Each of the metal strips may be more than 8 μm in thickness, and more than 40 μm in width. Further, each of the bond wires may be between about 10 mils and about 30 mils in height. The second inductor, and the metal-insulator-metal capacitor first and second metal layers may be formed from the same materials.

The first die may have a via hole formed therethrough between the conductive back plate and the metal-insulator-metal capacitor second metal layer. In such an embodiment, the via hole is filled with an interconnect metal.

As discussed in the preceding background description, the conventional shunt LC matching network illustrated in FIG. 1 utilizes long bond wires to connect a MOSCAP die with a base station power amplifier LDMOS die, and to provide inductance in series with a high capacitance. The present invention includes an integrated passive device (IPD) design for the shunt LC matching network that optimizes the bond wire length by using one or more parallel micro-striplines to provide inductance in place of bond wires. In other words, the IPD is electrically connected to the LDMOS die using relatively small bond wires, and the shunt LC inductance is distributed between both the bond wires and the IPD micro-stripline inductors. The micro-stripline inductance is more easily reproduced than long bond wire inductance. Further, because a significant amount of inductance is attributed to the IPD die, the total inductance is tightly controlled. The micro-stripline inductors have better thermal dissipation properties than do long bond wires. Consequently, the IPD design provides improved thermal properties and reliability.

Figure 3:
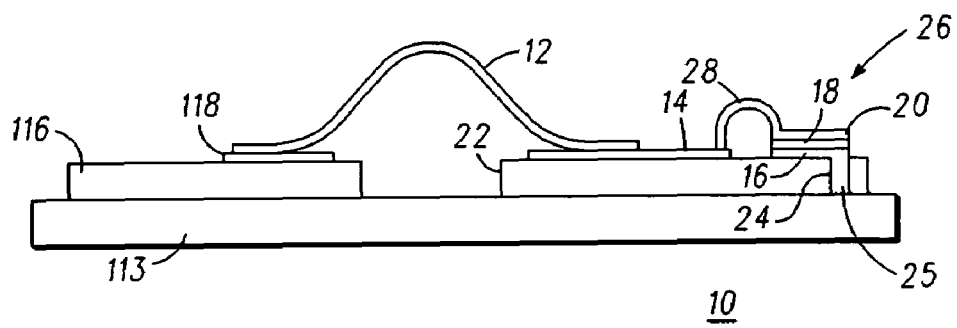
FIG. 3 is a side view of an exemplary LC output impedance matching shunt, including an integrated passive inductor and capacitor in series, according to an embodiment of the present invention.
Figure 5:
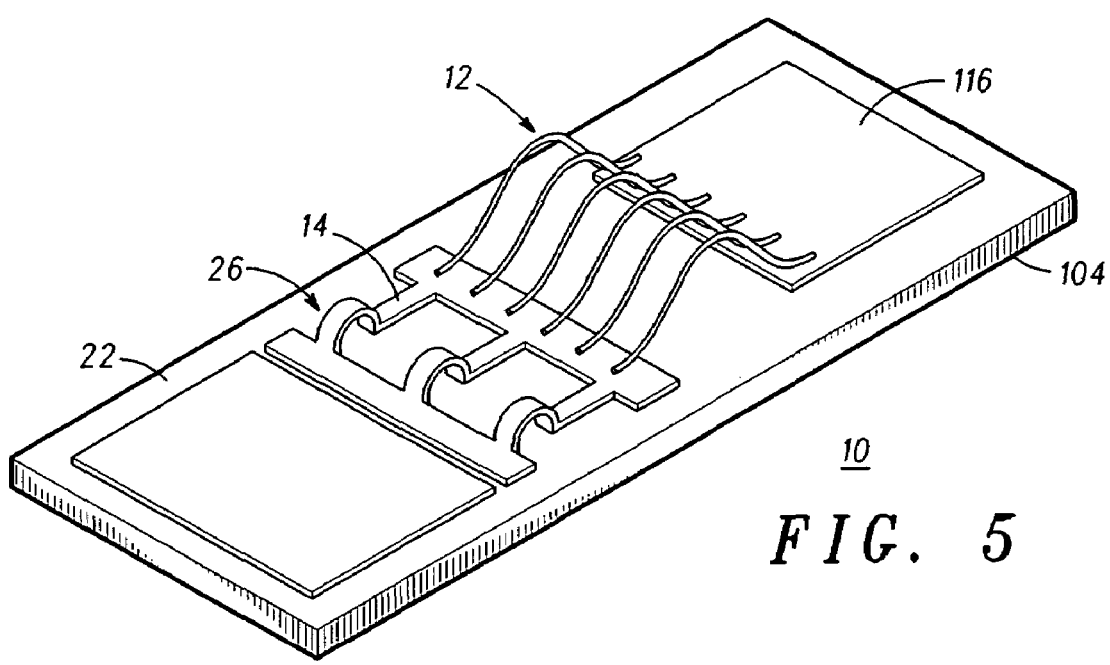
FIG. 5 is a top isometric view of the LC output impedance matching shunt illustrated in FIG. 3.

FIGS. 3 and 5 are, respectively, side and top isometric views of an exemplary IPD design 10. The LC impedance output matching shunt is disposed on a metal platform 113, which also functions as a ground. A bond wire 12 is used to connect two separate dies disposed on the platform 113. Situated on one platform area is the previously discussed base station power amplifier LDMOS die 116, and an IPD die 22 is situated on a separate platform area.

Figure 4:
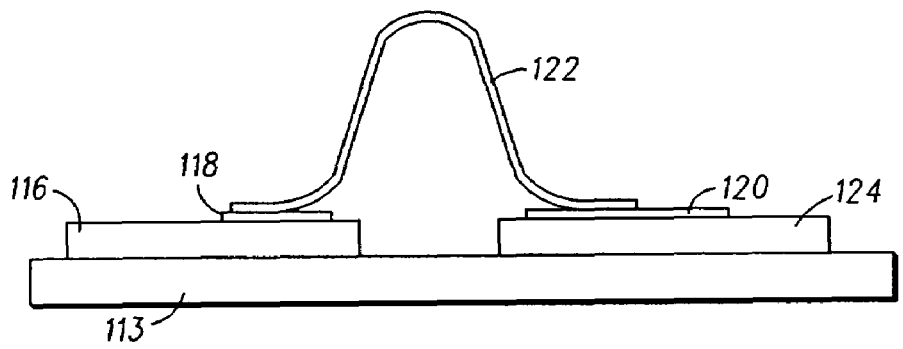
FIG. 4 is a side view of a conventional shunt LC output impedance matching network.

Exemplary bond wires 12 include coils that create inductance between the LDMOS die 116 and the IPD die 22. FIG. 4 is a side view of a conventional assembly 220, including a bond wire 122 that creates inductance between an LDMOS die 116 and a MOSCAP die 124. Contact between the conventional bond wire 122 and the dies 116, 124 is facilitated by bond pads 118, 120. As seen when comparing the assemblies of FIGS. 3 and 4, the bond wires 12 of the present invention is much lower in height, and therefore shorter in length, than the conventional bond wires 122. According to one embodiment, the bond wires 12 of the present invention are between about 10 mils and about 30 mils in height (between about 250 and about 750 μm), while the conventional bond wires 122 have a height of about 45 mils (~1.1 mm).

The assembly for the base station power amplifier LDMOS die 116 is essentially the same for both the conventional assembly 220 and the exemplary assembly 10, although in the current invention the LDMOS die 116 may alternatively be a III-V compound semiconductor die. However, the MOSCAP die 124 in the conventional LC shunt is replaced with the IPD die 22, which includes a plurality of integrated inductor strips 14 coupled to the bond wires 12, and an integrated MIM capacitor 26 that includes lower and upper metal layers 16, 20 and a dielectric layer 18 between the metal layers 16, 20. The MIM capacitor lower metal layer 20 is grounded to the metal platform 113 by way of a via hole 24 formed through the IPD die 22.

The IPD die 22 is a substrate having passive components integrally formed therewith. The substrate 22 may be a high resistivity silicon wafer or other insulating or semi-insulating wafer. An exemplary substrate is a GaAs wafer because GaAs is an optimal material for low-loss RF passive elements. A suitable dielectric such as SiN is deposited onto the substrate 22, although the dielectric layer is not illustrated.

The inductor strips 14 are coupled to the bond wires 12, and the combined bond wires 12 and inductor strips 14 together provide a combined inductance in series with the MIM capacitor 26. For ease of fabrication the IPD metals, including the inductor strips 14, and the MIM capacitor lower and upper metal layers 16, 20 are formed from the same materials such as gold, copper, or aluminum in an exemplary embodiment, although a variety of conductive metals may be used. Because the IPD inductor strips 14 place a significant amount of inductance on the IPD die 22, the total inductance is tightly controlled and highly reproducible. Further, the inductor strips 14 have improved thermal dissipation properties with respect to bond wires.

The dimensions for the inductor strips 14 are pre-calculated with inductor loss and inductor resonance as major factors. For example, inductor loss improves with wider inductor strips 14. However, the inductor resonance, which is determined by the inductor parasitic capacitance to ground, decreases as the inductor strips 14 are widened. Other factors that affect inductor loss include the inductor thickness, and spacing to ground. Exemplary inductor strips 14 are more than 8 μm in thickness, more than 40 μm in width, and between about 10 mils and about 30 mils in height (between about 250 and about 750 μm).

The distance between the inductor strips 14 and the metal platform 113 that functions as a ground is determined by the IPD die thickness. Factors that affect the optimal IPD die thickness include improving the inductor loss, and ease of manufacture. For example, a thick IPD die improves inductor loss. However, subsequent die processing, as in formation of the via hole 24 through the IPD die 22, is less efficient for a relatively thick IPD die 22. In the exemplary embodiment employing a GaAs substrate, the IPD die 22 is between about 3 and about 8 mils (between about 75 and about 200 μm) in thickness, and the inductor strips 14 are consequently disposed between about 75 and about 200 μm from the metal platform 113.

The inductor strips 14 are connected to the MIM capacitor upper metal layer 20 using a plurality of air bridges 28 disposed over the IPD die 22. In a preferred embodiment, the air bridges 28 are formed using lithography, deposition, and plating techniques. The air bridges 28 may also be formed using bond wires, although such an assembly would be less efficient and relatively bulky. Similarly, the metal filling the via hole 24 and extending through the IPD die 22 to connect the MIM capacitor lower metal layer 16 to the metal platform 113 is preferably formed using lithography, deposition, and plating techniques instead of from bond wires to reduce cost, substrate size, and overall package size.

Figure 6:
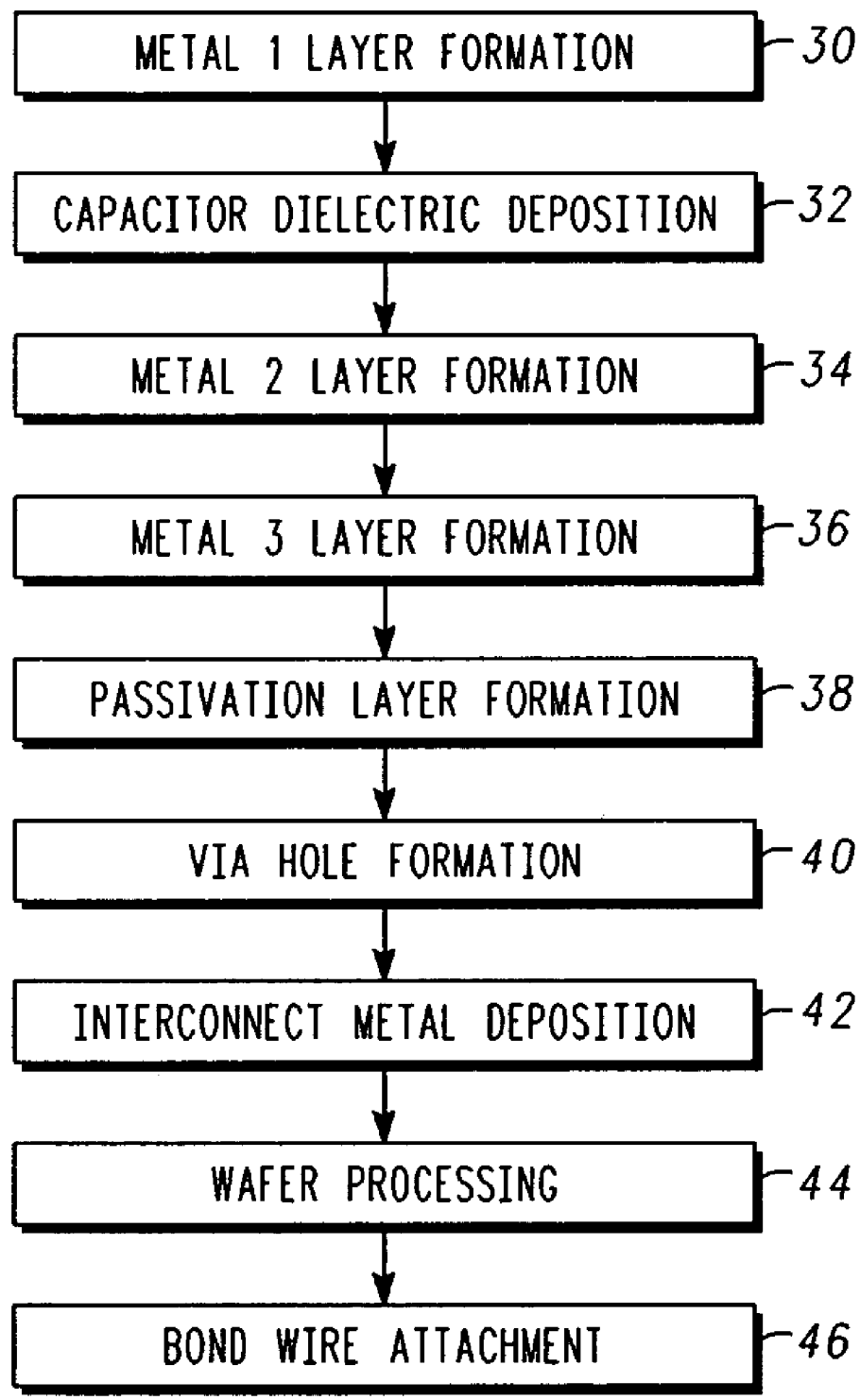
FIG. 6 is a flow diagram outlining an exemplary method for manufacturing the shunt LC output impedance matching shunt according to an embodiment of the present invention.

FIG. 6 is a flow chart that outlines the steps for manufacturing an exemplary IPD die and coupling it with bond wire coils to produce a shunt LC matching network. In order to form the IPD components, including the metal inductor strips 14 and the capacitor layers 16, 20, the metal layers are deposited and the desired conductive traces are formed by sputtering, plating, evaporation, and/or etching or other suitable methods. The metal layers are typically referred to as "metal 1," "metal 2," "metal 3," and so on to indicate the order in which they are deposited or formed onto the substrate during the fabrication process. Formation of each of the metal layers may include a series of steps including depositing a seed metal by a suitable method such as sputtering or evaporation, applying a photoresist, covering the exposed seed metal with a conductive metal plating, and removing the photoresist and non-plated seed material. Although a variety of metals can be used to form the IPD components, in the following exemplary procedure the seed metal is TiW and the plating metal is Au.

Step 30 comprises formation of a metal 1 layer on a GaAs wafer that will later be processed to a suitable shape to form the IPD die 22. The wafer can also be a high resistivity silicon or other suitable insulating or semi-insulating material. At least the wafer areas on which the metal 1 layer is to be formed are covered with an insulating material such as SiN. The entire metal 1 layer, including the seed layer and the conductive metal plating, forms the MIM capacitor lower metal layer 16, and has a thickness of about 0.5 to about 3 μm.

Step 32 comprises forming the capacitor dielectric layer 18 over the metal 1 layer. The dielectric layer 18 may be formed from any suitable dielectric material, and in the present example is SiN. A series of deposition and etching steps are used to form the dielectric layer 18. One suitable deposition method includes a plasma-enhanced chemical vapor deposition process.

Step 34 comprises forming a metal 2 layer over the capacitor dielectric layer 18. The metal 2 layer forms the MIM capacitor upper layer 20, and has a thickness of about 1 μm to about 3 μm.

Step 36 comprises forming a metal 3 layer to form at least the air bridge 28. The air bridge 28 connects the inductor strips 14 to the MIM capacitor upper layer 20, and has a thickness of about 7 μm to about 13 μm. The inductor strips 14 are formed during one or more of the metal 1, metal 2, and metal 3 formation steps 30, 34, and 36, particularly when each of the metal layers are formed from the same metal or compatible metals for forming the inductor strips 14.

After forming the inductor strips 14 and the MIM capacitor 26 on the wafer during steps 30 to 36, a passivation layer is formed over these IPD components as step 38. A suitable passivation layer is SiN, although many other suitable materials may be used to protect the components on the wafer.

Step 40 comprises forming the via hole 24 through the wafer. The via hole 24 connects the previously-formed MIM capacitor lower layer 16 to the metal platform 113, and the MIM capacitor lower layer 16 is formed over the wafer area through which the via hole 24 is to be formed. Consequently, the via hole 24 is formed by mounting the wafer face-down on a carrier, lapping and polishing the wafer to a final thickness of about 3 to about 8 mils (about 75 to about 200 μm), and using a photolithography process to dry or wet etch through the wafer until the via hole 24 reaches the MIM capacitor lower layer 16.

Step 42 comprises filling the via hole 24 with a suitable interconnect metal 25. In an exemplary embodiment, the interconnect 25 is formed from the same metal as the MIM capacitor lower layer 16, although any suitable conductive metal may be used to form the interconnect 25.

Steps 30 to 42 effectively complete formation of the wafer, with the exception of shaping and attachment steps. Step 44 comprises processing the wafer to complete formation of the IPD die 22. The wafer is mounted to a backing using saw tape, and the wafer is sawed to a predetermined size and shape. Then, the completed IPD die 22 is attached to the metal platform 113 by performing a soldering or other joining technique. In this configuration, the interconnect 25 is joined to the metal platform 113. Finally, step 46 comprises attaching the bond wires 12 to the inductor strips 14 using a wire bonding or other joining technique, and thereby completing the LC shunt matching circuit.

The previously-described LC shunt matching network improves matching impedance reproducibility by partially substituting thin film-based processing techniques for conventional wire-bonding techniques without sacrificing the amount of inductance that wire bonds provide. For assemblies in which conventional bond wire inductors would be too tall or bulky to be packaged, the integrated passive LC shunt provides a package-integrated solution. Further, the shortened bond wire inductors improve thermal performance and system reliability. In addition, the integrated passive LC shunt improves the matching network Q factor and thereby improves the overall performance of the power amplification system, or other system, in which the circuitry is incorporated.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A method of manufacturing an integrated impedance matching network, the method comprising the steps of:
    forming a first inductor on a first die having top and bottom surfaces;
    forming a capacitor first metal layer on the first die top surface;
    forming an insulator layer on the capacitor first metal layer;
    forming a capacitor second metal layer on the insulator layer;
    coupling the capacitor second metal layer to the first inductor;
    mounting the first die bottom surface to a conductive plate;
    coupling the capacitor first metal layer to the conductive plate; and
    coupling the first inductor to a second inductor that bridges between the first die and a second die that is mounted on the conductive plate.

2. The method according to claim 1, wherein the first die comprises an insulating or semi-insulating substrate.

3. The method according to claim 2, wherein the first die comprises GaAs.

4. The method according to claim 1, wherein the first die is between about 75 and about 200 μm in thickness.

5. The method according to claim 1, wherein the second inductor comprises a plurality of bond wires, and the first inductor comprises a plurality of metal strips.

6. The method according to claim 5, wherein each of the metal strips is more than 8 μm in thickness, and more than 40 μm in width.

7. The method according to claim 5, wherein each of the bond wires is between about 10 mils and about 30 mils in height.

8. The method according to claim 1, wherein the second die is an LDMOS die.

9. The method according to claim 1, wherein the second die is a III-V compound semiconductor die.

10. The method according to claim 1, wherein the second die comprises a power amplification circuit.

11. The method according to claim 1, wherein the step of coupling the capacitor first metal layer to the conductive plate comprises the steps of:
    forming a via hole through the first die before mounting the first die bottom surface; and
    filling the via hole with an interconnect metal.

12. The method according to claim 1, wherein the first inductor, and the capacitor first and second metal layers are formed from the same materials.

13. The method according to claim 1, wherein the step of coupling the capacitor second metal layer to the first inductor includes forming a third metal layer that connects the capacitor second metal layer to the first inductor.

14. The method according to claim 13, wherein the first inductor, the capacitor first and second metal layers, and the third metal layer, are all formed from the same materials.

15. The method according to claim 1, wherein the integrated impedance matching network is part of a power amplifier for a base station that amplifies and transmits remote signals.

16. The method according to claim 1, wherein the step of forming the first inductor is performed while performing one or more of the steps of forming the capacitor first and second metal layers and the step of coupling the capacitor second metal layer to the first inductor.

17. A method of manufacturing an integrated impedance matching network, the method comprising the steps of:
    forming a first inductor on a first die having top and bottom surfaces;
    forming a first capacitor layer from a first metal on the first die top surface while forming the first inductor using the first metal;
    forming an insulator layer on the capacitor first metal layer;
    forming a second capacitor layer from a second metal on the insulator layer while continuing to form the first inductor using the second metal;
    coupling the capacitor second metal layer to the first inductor;
    mounting the first die bottom surface to a conductive plate;
    coupling the capacitor first metal layer to the conductive plate; and
    coupling the first inductor to a second inductor that bridges between the first die and a second die that is mounted on the conductive plate.

18. The method according to claim 17, wherein the step of coupling the capacitor second metal layer to the first inductor includes forming a layer from a third metal that connects the capacitor second metal layer to the first inductor, and that further forms the first inductor.

19. The method according to claim 17, wherein the step of coupling the capacitor first metal layer to the conductive plate comprises the steps of:
    forming a via hole through the first die before mounting the first die bottom surface; and
    filling the via hole with an interconnect metal.

20. The method according to claim 17, wherein the second inductor comprises a plurality of bond wires, and the first inductor comprises a plurality of metal strips.

* * * * *